United States Patent [19]
Bergemont et al.

[11] Patent Number: 5,552,619
[45] Date of Patent: Sep. 3, 1996

[54] CAPACITOR COUPLED CONTACTLESS IMAGER WITH HIGH RESOLUTION AND WIDE DYNAMIC RANGE

[75] Inventors: Albert Bergemont, Palo Alto; Carver A. Mead, Pasadena; Min-hwa Chi, Palo Alto; Hosam Haggag, Santa Clara, all of Calif.

[73] Assignee: National Semiconductor Corporation, Santa Clara, Calif.

[21] Appl. No.: 436,181

[22] Filed: May 10, 1995

[51] Int. Cl.$^6$ .................................................. H01L 31/06
[52] U.S. Cl. .......................... 257/291; 257/292; 257/443; 257/448; 257/462
[58] Field of Search .................................. 257/443, 291, 257/292, 448, 462

[56] References Cited

U.S. PATENT DOCUMENTS

| | | | |
|---|---|---|---|
| 4,814,846 | 3/1989 | Matsumoto et al. | 357/30 |
| 4,847,668 | 7/1989 | Sugawa et al. | 357/30 |
| 4,952,788 | 8/1990 | Berger et al. | 250/208.1 |
| 4,972,243 | 11/1990 | Sugawa et al. | 357/30 |
| 5,097,305 | 3/1992 | Mead et al. | 257/443 X |
| 5,260,592 | 11/1993 | Mead et al. | 257/443 X |
| 5,289,023 | 2/1994 | Mead | 257/291 |
| 5,324,958 | 6/1994 | Mead et al. | 257/443 X |

OTHER PUBLICATIONS

Fossum, Eric R., "Active–Pixel Sensors Challenge CCDs", Laser Focus World, Jun. 1993, pp. 83–87.

*Primary Examiner*—William Mintel
*Attorney, Agent, or Firm*—Limbach & Limbach L.L.P.

[57] ABSTRACT

A capacitor coupled contactless imager structure and a method of manufacturing the structure results is a phototransistor that structure includes an N-type collector region formed in P-type semiconductor material. A P-type base region is formed in the collector region. An n-doped polysilicon emitter contact is formed in contact with the surface to the P-type base region such that an n+ epitaxial region is formed in the base region as the emitter of the phototransistor. Silicon dioxide separates the poly1 emitter contact and exposed surfaces at the base region from a layer of poly2 about 3000–4000 Å thick that partially covers the base region; the gates of the CMOS peripheral devices are also poly2. The poly2 over the base region serves as a base coupling capacitor and a row conductor for the imager structure. The thickness of the poly2 capacitor plate allows it to be doped utilizing conventional techniques and silicided to improve the RC constant.

1 Claim, 4 Drawing Sheets

CAPACITOR COUPLED CONTACTLESS IMAGER WITH HIGH RESOLUTION AND WIDE DYNAMIC RANGE

BACKGROUND OF THE INVENTION

1. Field of the Invention

The present invention relates to photosensing elements and, in particular, to a process for manufacturing a capacitor coupled contactless imager that uses poly1 as the phototransistor emitter contact and poly2 to form the gates of the peripheral CMOS transistors and to partially cover the phototransistor base region as the coupling capacitor. This approach results in higher capacitive coupling and smaller pixel cell size than prior art imagers, thereby providing higher resolution and wider dynamic range.

2. Discussion of Related Art

Eric Fossum, "Active-Pixel Sensors Challenge CCDs", Laser Focus World, pp. 83–87, June 1993, discusses emerging active-pixel sensor technology that is poised to replace charge coupled device (CCD) technology in many imaging applications.

As discussed by Fossum, a CCD relies on charge shifting to read out an image. Since it is very difficult to achieve 100% charge transfer efficiency in a CCD structure, performance is sometimes degraded below acceptable levels. In contrast to CCD technology, an active-pixel sensor operates similarly to a random access memory (RAM), wherein each pixel contains its own selection and readout transistors. The signal readout then takes place over conductive wires rather than by shifting charge. Thus, active pixel sensor technology provides advantages over CCD technology such as random access, nondestructive readout and intergrability with on-chip electronics.

In U.S. Pat. No. 5,289,023, issued Feb. 22, 1994, Carver A. Mead discloses a photosensing pixel element that uses a bipolar phototransistor as both as integrating photosensor and a select device. In Mead's preferred embodiment, the phototransistor is a vertical structure having its collector disposed in a substrate of N-type silicon. The base terminal of the bipolar phototransistor, which comprises a p-doped region disposed within the collector region, is utilized as the select node for the pixel. Conventional field oxide regions are employed to isolate the base regions of adjoining phototransistors. An n-doped polysilicon line is disposed over the surface of the substrate and is insulated therefrom except in regions where it is in contact with the p-doped base regions. Where the n-doped polysilicon is in contact with the surface of the p-type base region, if forms an n+ epitaxial region which serves as the emitter of the phototransistor. The polysilicon line provides the emitter contact.

As further disclosed in the '023 patent, a plurality of the Mead phototransistors may be arranged in an array of rows and columns. The bases of all phototransistors in a row of the array are capacitively coupled together to a common row-select line, and the emitters of all phototransistors in a column are integral with a column sense line. The input of a sense amplifier is connected to the sense line of each column of integrating photosensors. The sense line is connected to the inverting input of an amplifying element of an integrating sense amplifier. A capacitor, preferably a varactor, is also connected between the inverting input and the output of the amplifying element. Exponential feedback is provided in the sense amplifier for signal compression at high light levels. The outputs of the sense amplifiers are connected to sample/hold circuits. The rows of the array are selected one at a time and the outputs of the sample/hold circuits for each row are scanned out of the array while the pixel data for the next row are sampled.

U.S. Pat. No. 5,289,023 is hereby incorporated by reference in its entirety.

In the operation of the pixel imager array disclosed in the '023 patent, the emitter current of the pixel during a read operation is typically in the µA range. Therefore the junction leakage currents set a limit on the dynamic range at low light levels and should be as small as possible. Furthermore, the base coupling capacitor needs to be large compared with the junction capacitance of the emitter, base and collector such that, during the image integration period, the base remains reverse biased with respect to the emitter and collector.

SUMMARY OF THE INVENTION

The present invention provides a capacitor contactless imager structure and a method of manufacturing the structure. The imager structure includes an N-type collector region formed in P-type semiconductor material. A P-type base region is formed in the collector region. An n-doped polysilicon emitter contact is formed in contact with the surface of the P-type base region such that an n+ epitaxial region is formed in the base region as the emitter of the imager structure. Silicon dioxide separates the poly1 emitter contact and exposed surfaces at the base region from a layer of poly2 about 3000–4000 Å thick that partially covers the base region; the gates of the CMOS peripheral devices are also poly2. The poly2 over the base region serves as a base coupling capacitor and a row conductor for the imager structure. The thickness of the poly2 capacitor plate allows it to be doped utilizing conventional techniques and silicided to improve the RC constant.

A better understanding of the feature and advantages of the present invention will be obtained by reference to the following detailed description and accompanying drawings which set forth an illustrative embodiment in which the principles of the invention are utilized.

DETAILED DESCRIPTION OF THE INVENTION

FIGS. 1A–1K provide a sequence of cross-section drawings illustrating a process flow for fabricating a capacitor coupled contactless imager structure that uses poly1 to form the emitter contact of the phototransistor and poly2 to form the gates of the peripheral CMOS devices and to partially cover the base region as a coupling capacitor. The process flow is based upon 0.8 µm CMOS technology.

Figure 1A:
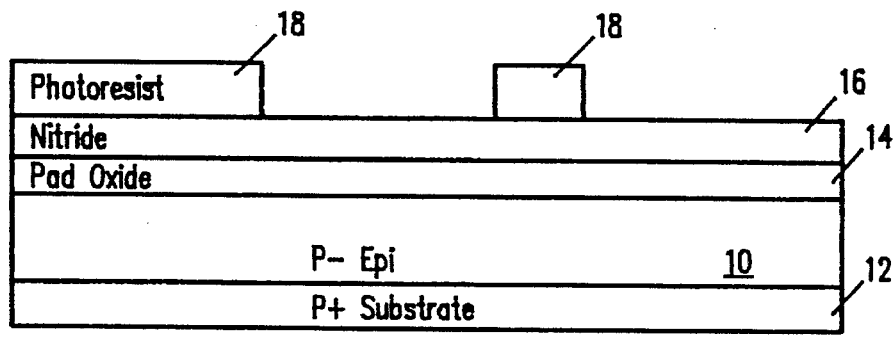
FIGS. 1A–1K provide a sequence of cross-section drawings illustrating a method of fabricating a capacitor coupled contactless imager structure in accordance with the present invention.

Referring to FIG. 1A, the process begins with a standard P-\P+, <100> epi, 24–36 Ωcm, 11 micron wafer; the P-epitaxial silicon 10 formed on P+ silicon substrate 12 is used for standard CMOS processing. After a conventional ASM global mark bench etch step, a layer of twin well pad oxide 14 about 450 Å thick is grown on the epi layer 10 in a wet oxidation step performed at about 900° C. This is followed by formation of a nitride layer 16 about 1350 Å thick at about 775° C. A twin well photoresist mask 18 is then formed on the nitride layer 16 to define regions of the P– epi layer 10 in which the twin N-wells are to be formed.

Figure 1B:
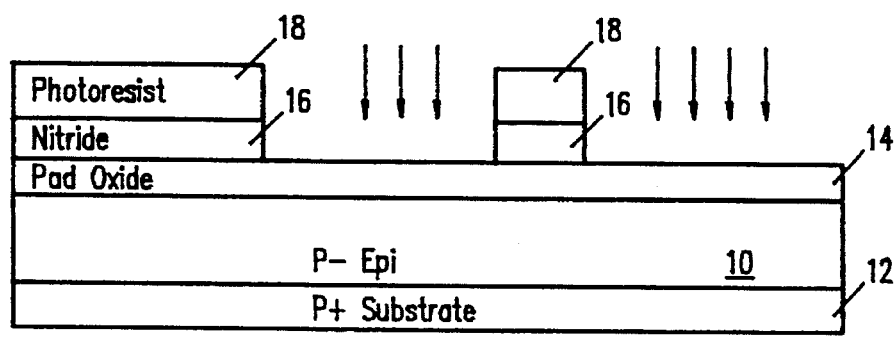

Referring to FIG. 1B, the exposed nitride layer 16 is then etched using, for example, an $SF_6$ etch in a Lam 4400 etcher operated at 350 mT and 200 W. Following the nitride etch, phosphorous is implanted into the epi layer 10 at an implant energy of 140 Kev and a dopant concentration of 5.2E12 cm–2. The twin well mask 18 is then stripped.

Figure 1C:
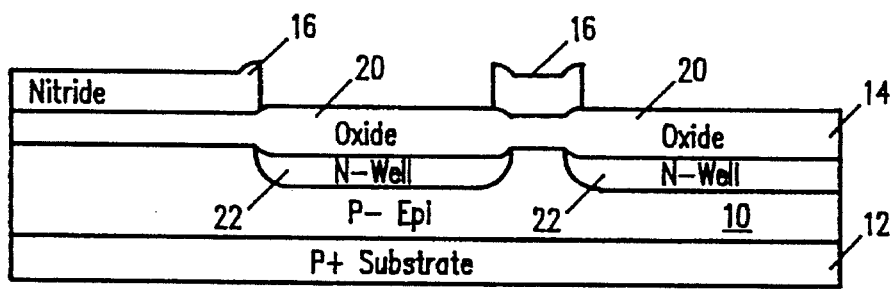

Next, a selective wet oxidation step is performed at about 950° C., resulting in the growth of about 5000–6000 Å of seal oxide 20 over the N-wells 22, as shown in FIG. 1C.

Figure 1D:
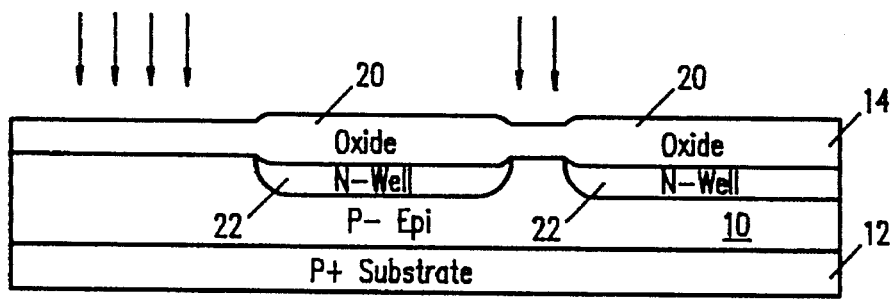
Figure 1E:
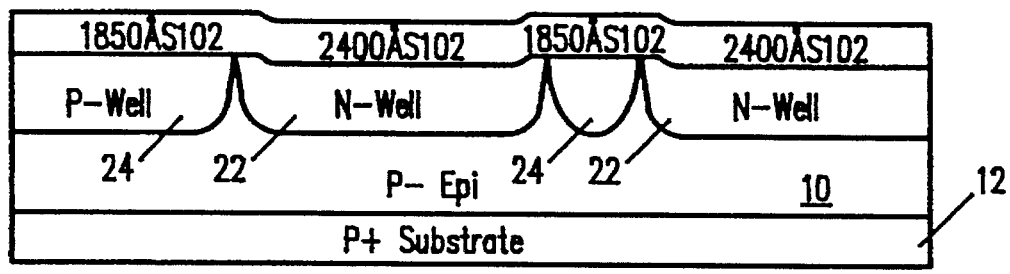

Referring to FIG. 1D, the remaining nitride 16 is then stripped and boron ($BF_2$) is implanted at 150 Kev, 2.7E12 cm–2, to define P-well regions 24. The seal oxide 20 is then etched back to about 1800 Å over the N-wells 22 and a N-well/P-well drive in step is performed in $O_2$ at about 1100° C. This results in formation of oxide about 2400 Å thick over the N-wells 22 and about 1850 Å thick over the P-wells 24. The resulting structure is shown in FIG. 1E.

Next, the drive-in oxide is stripped and a layer of composite pad oxide 26 about 250 Å is grown in $O_2$ at about 900° C. for about 51 minutes. The pad oxide growth is followed by formation of a layer of composite nitride 28 about 1850 Å thick at 900° C. A photoresist composite mask, typically known as a diffusion mask, is then formed to define to-be-formed filed oxide (Fox) regions and the composite nitride 28 is etched back using, for example, $SF_6$ in a Lam 4400 etcher at 350 mT and 200 W. The composite mask is then stripped, resulting in the structure shown in FIG. 1F.

Figure 1F:
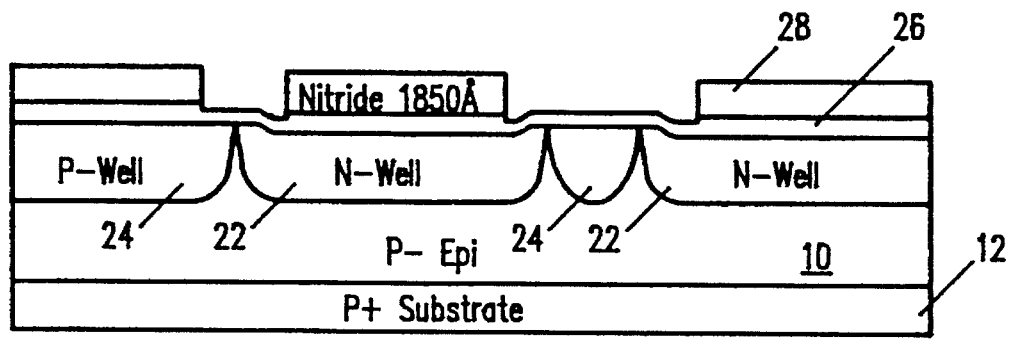
Figure 1G:
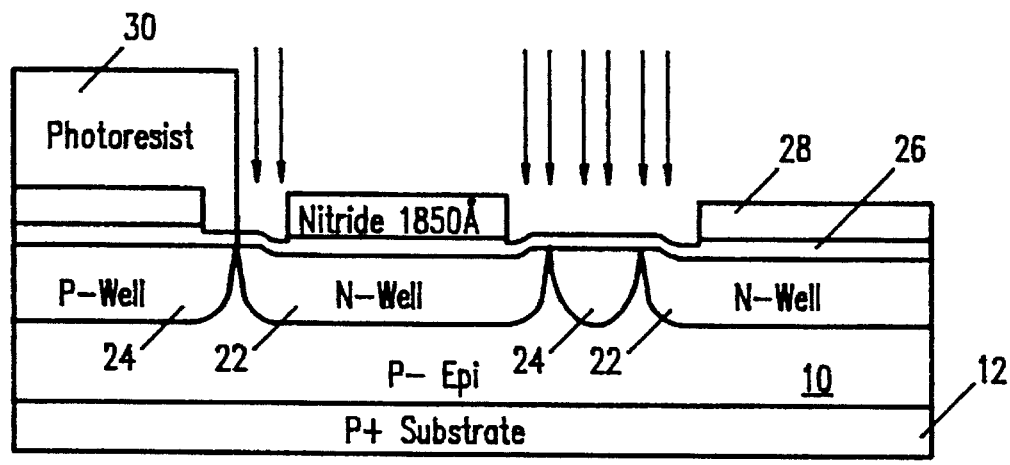
Figure 1H:
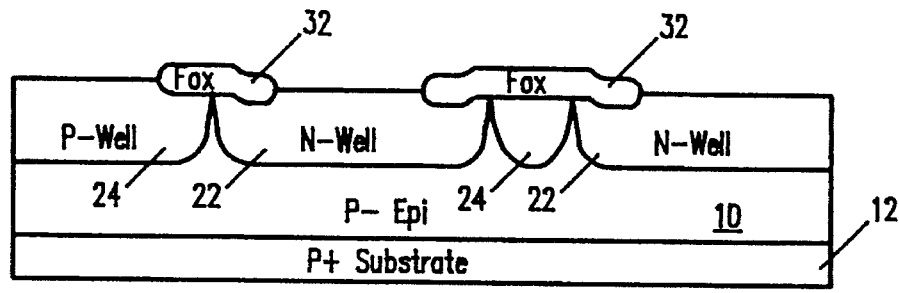
Figure 1I:
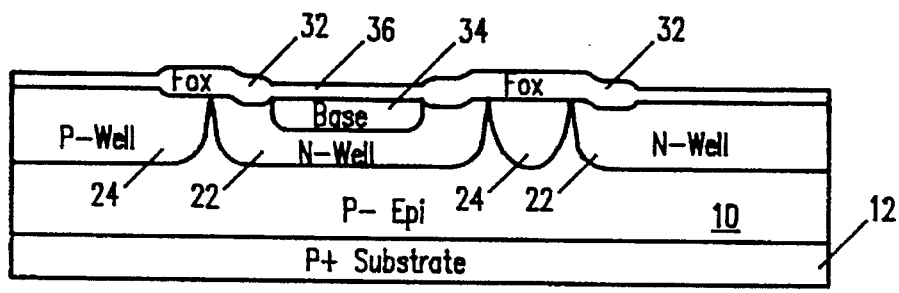

Next, as shown in FIG. 1G, a third photoresist mask (P-field mask) 30 is formed over the FIG. 1F structure and a P+ field implant is performed using boron at 30 Kev, 5.5613 cm–2. Field oxide regions 32 are then grown to a thickness of about 7000 Å in a wet oxidation step performed at 1000° C. for about 140 minutes. The composite nitride 28 and composite pad oxide 26 are then stripped, resulting in the structure shown in FIG. 1H.

A sacrificial oxide layer about 400 Å thick is then grown by wet oxidation at 900° C. for about 8.3 minutes and a threshold $V_T$ implant is performed. The periphery is then masked and a base implant is then performed using boron to define the base region 34. The periphery protection mask is then removed, resulting in the structure shown in FIG. 1I.

Figure 1J:
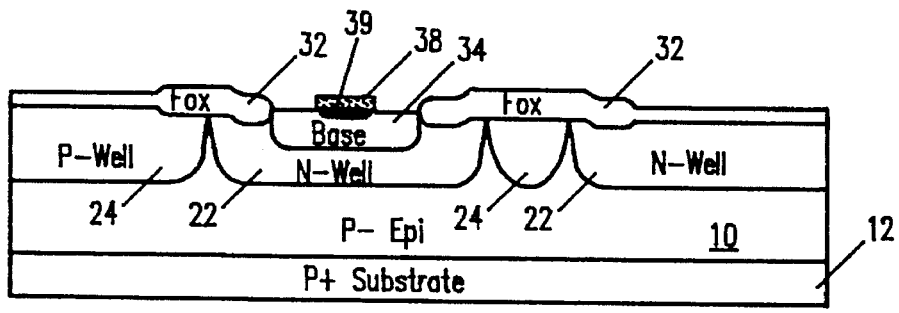
Figure 1K:
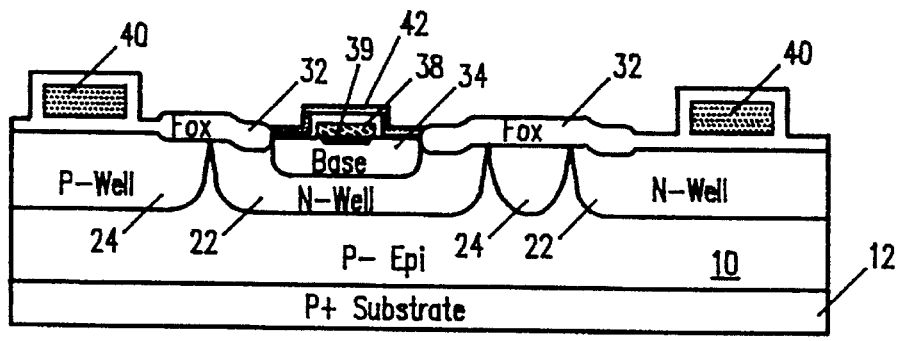

Referring to FIG. 1J, a second peripheral protection mask is then formed which also opens the base area of the phototransistor. The sacrificial oxide is removed from the base area and a first layer of polysilicon about 3250A thick is deposited and doped to the desired concentration, e.g. Arsenic at 100 Kev, 1.4E16 cm–2. A photoresist mask is then formed to define the polysilicon and the polysilicon is etched, for example using $Cl_2$/He in a Lam 4400 mT and 275 W, to define the poly1 emitter contact 38. Where the n-doped poly1 is in contact with the surface of the p-type base region 34, it forms an n+ epitaxial region 39 which serves as the emitter of the phototransistor. The resulting structure is shown in FIG. 1J.

The array is then masked and the remaining sacrificial oxide is stripped. The array mask is then removed and a differential oxide step is performed in oxygen at about 900° C. Next, a base link mask is formed, boron is implanted and the base link mask is stripped.

A second layer of polysilicon (poly2) about 3000–4000 Å thick is then formed (625° C., 300 mT, 8 min) and doped as desired. The poly2 layer is then masked and etched to define the gates 40 of the peripheral CMOS transistors and the upper plate 42 of the coupling capacitor. The poly2 base capacitor plate 42 only partially covers the base region 34, the exposed base area being the aperture for the image. The poly2 mask is then stripped and a source/drain re-oxidation results in the structure shown in FIG. 1K. Although not shown in FIG. 1K, the poly2 may be silicided to further redue the capacitor RC constant.

The process flow then proceeds with following conventional steps to complete the device structure: Mask LddN, Mask LddP, Mask N+, Mask P+, Mask Contact, Mask Metal, Mask Pads.

Figure 2:
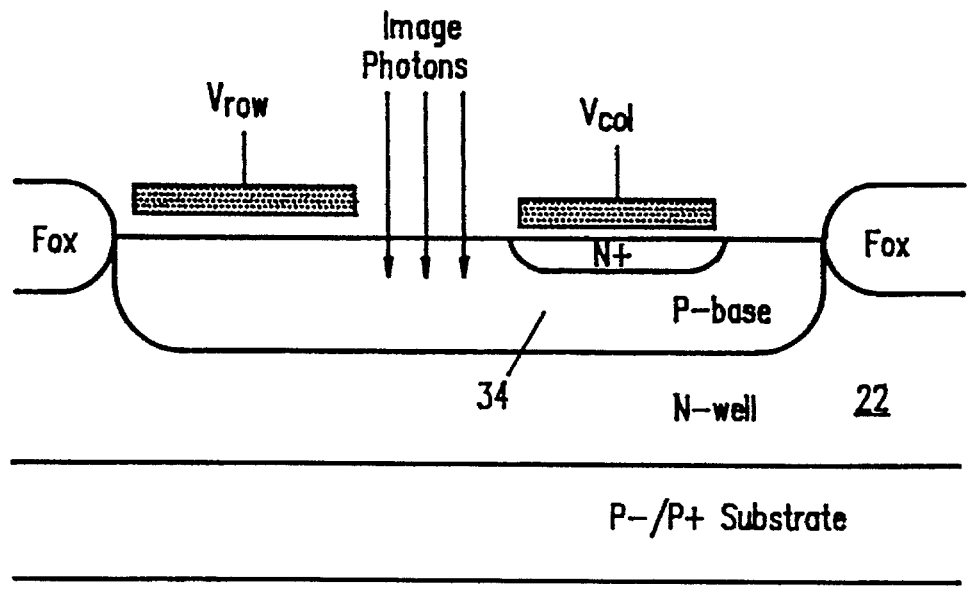
FIG. 2 is a cross-section drawing illustrating a capacitor coupled contactless imager structure fabricated in accordance with the method of the present invention.

FIG. 2 shows the final phototransistor structure. As shown in FIG. 2, the device requires no buried layer, collector epi-layer or back-seal. The poly1 38 serves as the poly emitter and column conductors. The poly2 42 serves as the base coupling capacitor and row conductors. The poly2 capacitor plate 42 only partially covers the base region, leaving an aperture for image charge generation. As stated above, the poly2 plate can be silicided for RC constant improvement. No metal contact is used in the imager array, leading to small pixel size (about 20u$^2$/pixel). The N-well serves as the collector, the P-base is formed by implantation, and all CMOS transistors are fabricated in accordance with a standard CMOS process flow.

Figure 3:
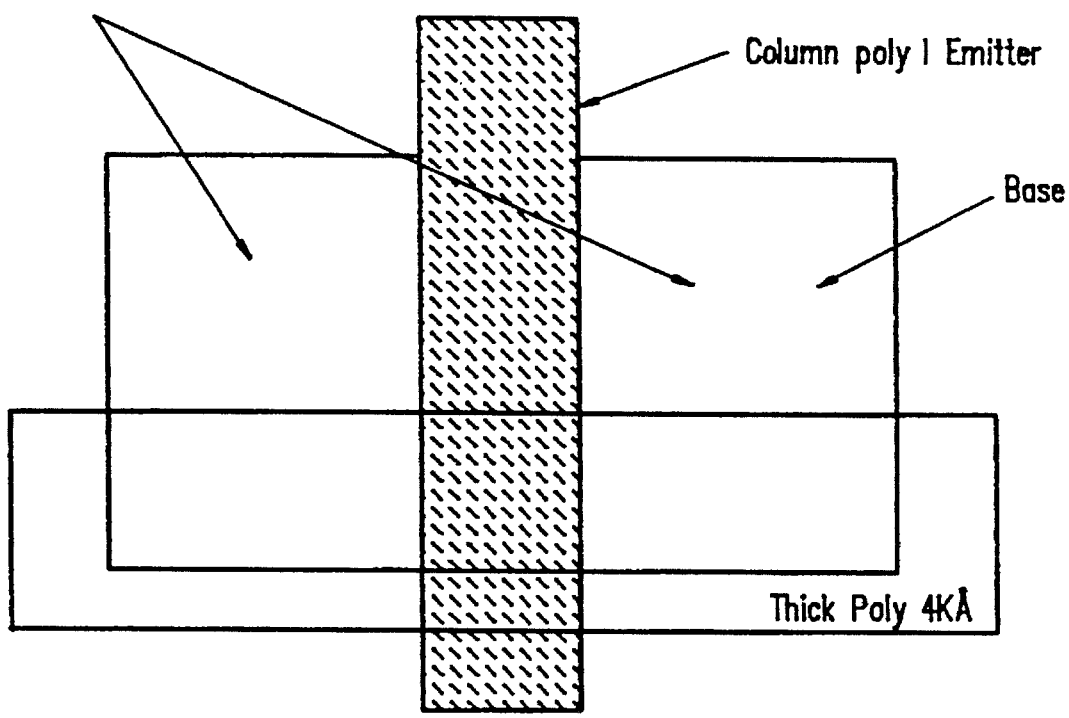
FIG. 3 is a layout illustrating a capacitor coupled contactless imager structure fabricated in accordance with the present invention.

FIG. 3 shows the layout of a contactless pixel phototransistor fabricated in accordance with above-described process. As shown in FIG. 3, the poly2 row (word) line runs over approximately one-half of the base region.

It should be understood that various alternatives to the embodiments of the invention described herein may be employed in practicing the invention. It is intended that the following claims define the scope of the invention and that methods and structures within the scope of these claims and their equivalents be covered thereby.

What is claimed:

1. A capacitor coupled contactless imager structure formed in the semiconductor substrate, the imager structure comprising:

a collector region of N-type conductivity formed in the P-type semiconductor material;

a base region of P-type conductivity formed in the collector region;

an n-doped polysilicon emitter contact formed in contact with a surface of the base region such that an n+ epitaxial emitter region is formed in the base region beneath the polysilicon emitter contact;

silicon dioxide formed over the polysilicon emitter contact and exposed surfaces of the base region; and a layer of second polysilicon about 3000–4000 Å which is formed on the silicon dioxide such that the layer of second polysilicon only partially covers the base region.

\* \* \* \* \*